US006476428B2

(12) United States Patent
Sevenhans

(10) Patent No.: US 6,476,428 B2
(45) Date of Patent: *Nov. 5, 2002

(54) FIELD EFFECT TRANSISTOR, CONTROL METHOD FOR CONTROLLING SUCH A FIELD EFFECT TRANSISTOR AND A FREQUENCY MIXER MEANS INCLUDING SUCH A FIELD EFFECT TRANSISTOR

(75) Inventor: Joannes Mathilda Josephus Sevenhans, Brasschaat (BE)

(73) Assignee: Alcatel, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 100 days.

(21) Appl. No.: 09/303,549

(22) Filed: May 3, 1999

(65) Prior Publication Data

US 2001/0013622 A1 Aug. 16, 2001

(30) Foreign Application Priority Data

May 11, 1998 (EP) .......................................... 98401126

(51) Int. Cl.$^7$ ............................................. H01L 29/80
(52) U.S. Cl. ...................... 257/271; 257/288; 257/368; 257/401
(58) Field of Search ................................. 257/271, 287, 257/368, 401, 270; 327/113; 455/333, 326, 330; 357/22, 46

(56) References Cited

U.S. PATENT DOCUMENTS 3,714,559 A * 1/1973 Bate ............................. 324/43
3,803,461 A * 4/1974 Beneking .................... 317/325

(List continued on next page.)

FOREIGN PATENT DOCUMENTS

| EP | 0 265 593 A2 | 5/1988 |
|---|---|---|
| EP | 0 837 556 A1 | 4/1998 |
| JP | 361063062 A | * 9/1984 |
| WO | WO 96/08041 | 3/1996 |

OTHER PUBLICATIONS

Gabara T: "Lorentz Force MOS Transistor", Proceedings. Tenth Annual IEEE International ASIC Conference and Exhibit (CAT. No. 97$^{th}$8334), Proceedings, Portland, OR, USA, Sep. 7–10, 1997, ISBN 0–7803–4283–6, 1997, New York, NY, USA, IEEE, USA, pp. 291–294 XP002094109.

"Electronic Principles, Second Edition" published, 1979, by Tate MacGraw–Hill Publishing Company Limited and Printed at Pearl Offset Press, Kirti Nagar, Industrial Area, New Delhi–110015, chapter 13.

(List continued on next page.)

*Primary Examiner*—O. Chaudhuri
*Assistant Examiner*—Nathan W. Ha
(74) *Attorney, Agent, or Firm*—Sughrue Mion, PLLC

(57) ABSTRACT

The field effect transistor includes a control terminal (G), a first main terminal (S) and a second main terminal (D1). The control terminal (G) is included to be coupled to gate voltage means which are adapted to provide a control voltage (Vg) which controls a flow of carriers (e) flowing from the first main terminal (S) to the second main terminal (D1). The field effect transistor further includes a third main terminal (D2) which is positioned and adapted in order to enable a high input resistance control current means (CS), which is coupled to the third main terminal (D2), to deviate part (e') of the flow of carriers from the first main terminal (S) to the third main terminal (D2). The third main terminal is called the double drain (D2) of the field effect transistor.

3 Claims, 3 Drawing Sheets

U.S. PATENT DOCUMENTS

| | | | | |
|---|---|---|---|---|
| 4,141,023 A | * | 2/1979 | Yamada | 357/23 |
| 4,254,430 A | * | 3/1981 | Beneking | 357/22 |
| 4,977,434 A | * | 12/1990 | Delagebeaudeuf | 357/22 |
| 5,306,969 A | | 4/1994 | Kimura | 327/113 |
| 5,528,067 A | | 6/1996 | Farb | 257/401 |
| 5,751,033 A | * | 5/1998 | Miya | 257/270 |
| 6,002,301 A | * | 12/1999 | Sugimura | 257/287 |

OTHER PUBLICATIONS

"Electronic Principles, Second Edition" published, 1979, by Tate MacGraw–Hill Publishing Company Limited and Printed at Pearl Offset Press, Kirti Nagar, Industrial Area, New Delhi–110015, paragraph–23–8 Spurioussignals, pp. 673–376.

Baker, T. and Bronner P., "Create a Low–Cost, Cellular–Telephone Handset" *Leadfeature*, Wireless Systems Design, Jan. 1996, pp. 25–33.

Mullet, B. and Sporer, G., "Finding Low–Voltage Solutions For Cellular Phones" *Feature*, Wireless Systems Design, Apr. 1996, pp. 43–45.

* cited by examiner

FIELD EFFECT TRANSISTOR, CONTROL METHOD FOR CONTROLLING SUCH A FIELD EFFECT TRANSISTOR AND A FREQUENCY MIXER MEANS INCLUDING SUCH A FIELD EFFECT TRANSISTOR

BACKGROUND OF THE INVENTION

The present invention relates to a field effect transistor as described in the preamble of claim 1, a control method realized by such a field effect transistor as described in the preamble of claim 2 and a frequency mixer means including such a field effect transistor as described in the preamble of claim 3.

Such a field effect transistor is already known in the art, e.g. from the book "*Electronic Principles*, Second Edition" published, 1979, by Tata McGraw-Hill Publishing Company Limited and Printed at Pearl Offset Press, Kirti Nagar, Industrial Area, New Delhi-110015. An active electronic device such as described more particular in chapter 13 "Field-effect transistors" of this book includes a control terminal called a gate, a first main terminal called a source and a second main terminal called a drain. This first paragraph of this chapter teaches how a gate voltage which is applied to the gate of the field effect transistor controls a flow of carriers which is flowing through a channel from the source to the drain. This means that a field effect transistor is a voltage-controlled device i.e. input voltage alone controls the output current.

It has to be remarked that the use of the terms source and drain is the same for n-channel or p-channel field effect transistors which means that for n-channel field effect transistors the carriers are conduction-band electrons and that for the p-channel field effect transistors the carriers are holes in the inversion region. Hence, conventional current flows from the drain to the source in n-channel field effect transistors and from the source to the drain in p-channel field effect transistors.

Although, that such a field effect transistor has a lot of advantages, however, as described on page 322, second paragraph, a main drawback of such a field effect transistor is the small control over the output current. This means that a field effect transistor is less sensitive to changes in input voltage than e.g. a bipolar transistor.

SUMMARY OF THE INVENTION

An object of the present invention is to provide a field effect transistor of the above known type but which provides an improved controllability and an additional degree of freedom over the flow of carriers from the source to the drain.

According to the invention, this object is achieved by the field effect transistor as described in claim 1 which is realizing the control method as described in claim 2 and which is included in the frequency mixer means described in claim 3.

Due to the fact that the field effect transistor further includes a third main terminal, called hereafter a double drain, positioned and adapted in order to enable a high resistance control current means, which is coupled to the double drain, deviation of part of the flow of carriers from the source to the double drain is enabled.

Indeed, by coupling a high input resistance control current means like e.g. a current source to the double drain an extra control is provided to the drain current of the field effect transistor. The field effect transistor becomes in this way a device with mixed control inputs : one voltage control input at the gate of the field effect transistor and one current control input at the double drain of the field effect transistor. Both control inputs are controlling the drain current i.e. the output current of the field effect transistor.

It has to be explained that the normal working of the field effect transistor has to be respected in the event when no control input is required via the double drain terminal. In this way it is expected to have a high impedance at the double drain terminal which explains the use of a high resistance control current means like e.g. a source current. On the other hand, in the event when the control current means is active, it is important to enable a deviation of part of the carriers, even when this part constitutes all the present carriers, when such is required. The high resistance control current means at the double drain terminal has to be dimensioned in such a way that both requirements are possible to be fulfilled. This will be discussed in a further paragraph.

It also has to be explained that the expression "positioned and adapted", used in the claims means that the double drain must be positioned as such that indeed a deviation of the carriers is possible. This will become more clear in the following paragraphs.

First, it should be clear that a distinction has to be made between e.g. the well known parallel drain transistor or the multiple finger transistor and the field effect transistor of this application. Indeed, the electrical field under the gate of a parallel drain transistor, formed by the flow of carriers from the source to one of the extra drains, has a direction which is substantially in parallel with the direction from the electrical field formed by the flow of carriers from source to first drain following the normal working of a field effect transistor. Such an extra field has the object to accelerate the charge in the channel whereby more carriers are flowing from the source to the drains. The electrical field of the present field effect transistor formed by the flow of carriers from source to second drain has a direction which is at least under an angle different from zero compared with the electrical field formed by the flow of carriers from source to first drain according to the normal working of the field effect transistor. This extra electrical field has the object to deviate the flow of carriers to the additional drain.

Yet, it should be clear that also a distinction has to be made between a double drain transistor such as e.g. used in the International Patent Application with publication number WO 9608041 A1 960314 and the double drain transistor of the present application. Indeed, the flow of carriers of the above mentioned patent application is switched from one drain to another drain based on the presence of a magnetic field. The object of this application is to measure time and space distributions of a magnetic field in a digital way.

Finally, it has to be explained that the result of a suited position of the double drain i.e. a deviation of the carriers towards the double drain, is one which can be directly and positively verified by tests which are known to the person skilled in the art. Indeed, by measuring the current of the first drain in the event when a plurality of different parts of the carriers are deviated under the control of a high input resistance control current means which is coupled to the double drain, a suited position of the double drain is simply confirmed.

Furthermore, such a suited positioning of the double drain does not require undue experimentation. Indeed, a first possible suited positioning of the double drain of the present application is e.g. in the same plane with the source and first drain but such that the direction gate—to—double drain is substantially perpendicular to the direction of the electrical field formed by the flow of carriers from source to first drain. In this case, the double drain is positioned closer to the source as the first drain which enables the current control means to deviate all the carriers, which are flowing from source to first drain, towards this double drain. A second possible suited positioning of the double drain is e.g. again in the same plane with the source and the first drain by such that a triangle is formed by the source, first drain and double drain round the channel.

It has to be remarked that an alternative solution to have an improved controllability over the drain current is the known dual gate field effect transistor. Such a dual gate field effect transistor controls the drain-source current through more than one gate electrode. Although that such a dual gate transistor is attractive to many circuit applications like e.g. mixer circuits and memory circuits, such a dual gate transistor is still a voltage control input device. An application of a dual gate field effect transistor is e.g. in the frequency mixer circuit as described in the above mentioned book "*Electronic Principles*, Second Edition" published, 1979, by Tata McGraw-Hill Publishing Company Limited and Printed at Pearl Offset Press, Kirti Nagar, Industrial Area, New Delhi-110015, and more particular in paragraph 23–8 Spurious signals, on pages 673 to 676. In this frequency mixer the incoming signal i.e. a radio signal is applied to one of the gates and a local oscillator i.e. a beat-frequency-oscillator drives the other gate in order to provide at the output of the mixer a signal with an audio frequency.

A possible application of the field effect transistor of the present invention is a frequency mixer means. This is described in claim 3. In such a frequency mixer means a first frequency is applied to the control terminal i.e. the gate and a second frequency is applied to the third main terminal i.e. the double drain. This application is in fact an example from what is mentioned in one of the above paragraphs not only part of the carriers, but all the carriers, which are flowing from the source to the first drain, are deviated to the double drain at predetermined time moments.

Furthermore it has to be remarked that although in the claims the presence of one extra drain is described, the present invention is not restricted to only one extra drain. Indeed, by providing more than one extra drain, each one being coupled to a high input resistance control current means, the deviation of part of the carriers is controlled through more than one extra drain electrode which provides an improved controllability and an additional degree of freedom over the flow of carriers from the source to the first drain.

It should be noticed that the term "including", used in the claims, should not be interpreted as being limitative to the means listed thereafter. Thus, the scope of the expression "a device including means A and B" should not be limited to devices consisting only of components A and B. It means that with respect to the present invention, the only relevant components of the device are A and B.

Similarly, it is to be noted that the term "coupled", also used in the claims, should not be interpreted as being limitative to direct connections only. Thus, the scope of the expression "a device A coupled to a device B" should not be limited to devices or systems wherein an output of device A is directly connected to an input of device B. It means that there exists a path between an output of A and in input of B which may be a path including other devices or means.

DETAILED DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
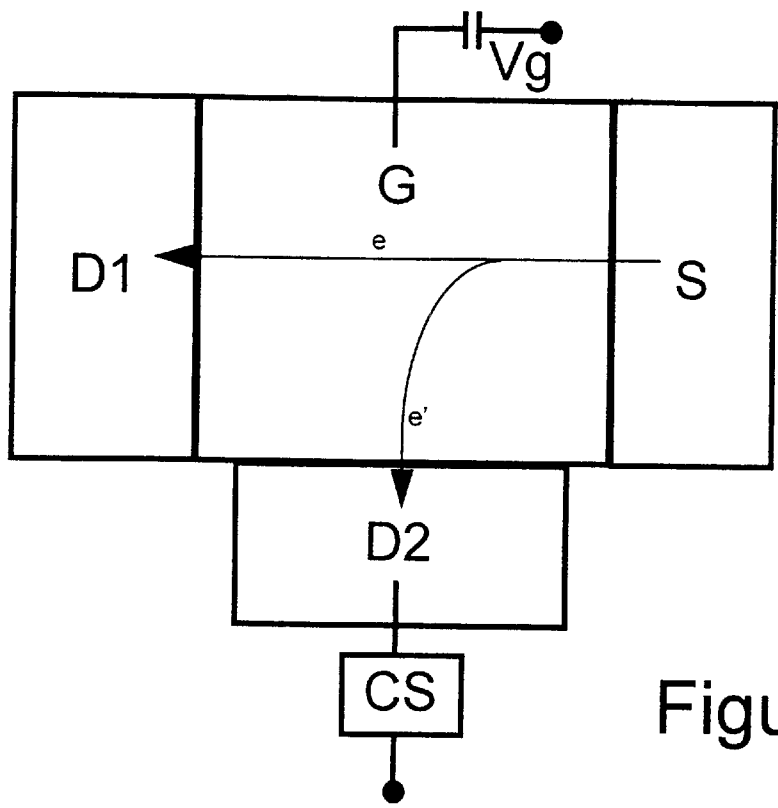
FIG. 1 is a basic structure of a first embodiment of a field effect transistor according to the present invention.

Referring to FIG. 1 a basic structure of a first embodiment of a field transistor according to the present invention is shown. The basic structure of the field effect transistor shows a two dimensional projection of the basic elements from the surface of the field effect transistor to the substrate. The field effect transistor includes a control terminal i.e. a gate G, a first main terminal i.e. a source S, a second main terminal i.e. a first drain D1 and a third main terminal i.e. a second drain called a double drain D2. The gate G is coupled to a gate voltage $V_g$ and the double drain D2 is coupled to a current source CS.

In order to explain the working of this double drain field effect transistor it is presumed to have an n-channel field effect transistor whereby the carriers are conduction-band electrons.

According to the traditional working of a field effect transistor, the gate voltage $V_g$ provides a control voltage $V_g$ to the gate G which controls a flow of carriers e (first arrow shown) flowing from the source S to the first drain D and which provides a current at the first drain D1.

The double drain D2 is positioned in the same plane with the source S and the first drain D1 but as such that the direction gate—to—double drain is substantially perpendicular to the direction of the electrical field formed by the flow of carriers from source S to first drain D1.

The current source CS, coupled to the double drain D2, controls a deviation from part of the carriers e' (second arrow shown) from the source S to the double drain D2 at predetermined time moments.

In the event when the current source CS is off i.e. the current at the double drain D2 is substantially zero, carriers e coming from the source S will still flow towards the first drain D1 and the traditional working of the field effect transistor is not disturbed.

In the event when the current source CS is put on, the double drain D2 has a potential drop whereby part of the carriers e' prefer to flow to this lower potential plane i.e. towards the double drain D2. Care has to be taken by the dimensioning of this field effect transistor in order to avoid that the voltage at the double drain D2 becomes bigger as the voltage at the source S. Indeed, in such a case, current is injected in the field effect transistor whereby the field effect transistor is driven into saturation mode. In such a case, the double drain becomes in fact a second source. This can be avoided by, as it is mentioned above, coupling a current source CS in stead of a voltage control to the double drain D2. In the event when the current source CS is good dimensioned, all the carriers e are deviated towards the double drain D2 and substantially no carriers are flowing to the first drain D1 whereby the current from the first drain D1 goes substantially to zero.

It has to be remarked that in fact the information applied by means of the control voltage to the gate G and the information applied by means of the resistance control current means CS to the double drain D2, are transferred and carried over, together and at the same time, to the drain current provided at the first drain D1 of the field effect transistor.

A further remark is that in the event that when a control voltage Vg with frequency f1 is applied to the gate G and a signal with frequency f2 is applied by a local oscillator to the double drain D2, the output of the field effect transistor i.e. the drain current provided at the first drain D1 is the product of the two applied signals. The field effect transistor acts in fact as a single transistor mixer.

Figure 2:
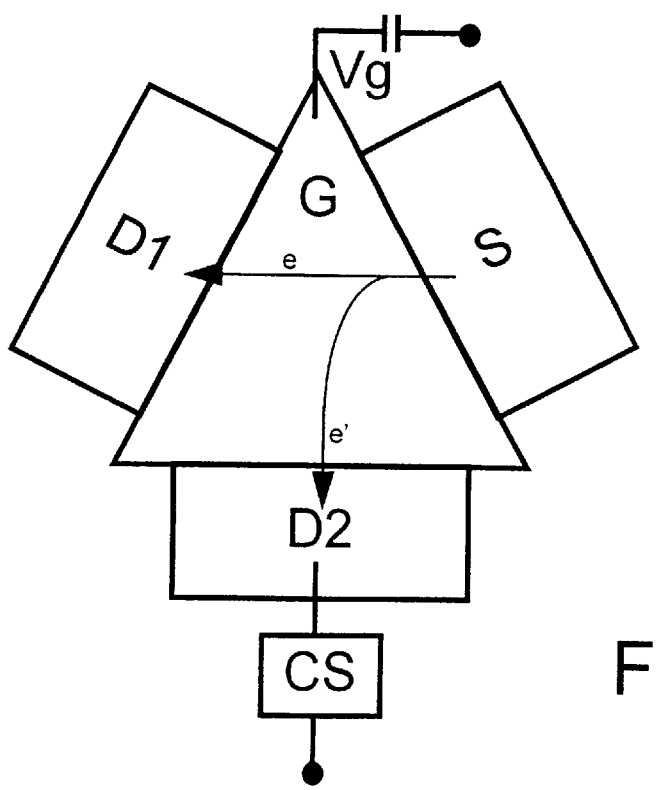
FIG. 2 is a basic structure of a second embodiment of a field effect transistor according to the present invention.

Referring to FIG. 2 a basic structure of a second embodiment of a field effect transistor according to the present invention is shown. The functional basic structure is similar to the field effect transistor shown in FIG. 1. The double drain D2 is positioned again in the same plane with the source S and the first drain D1. However, the main difference is that in FIG. 2 the double drain D2 is positioned as such that a triangle is formed by the source S, first drain D1 and double drain D2 round the channel.

Figure 3:
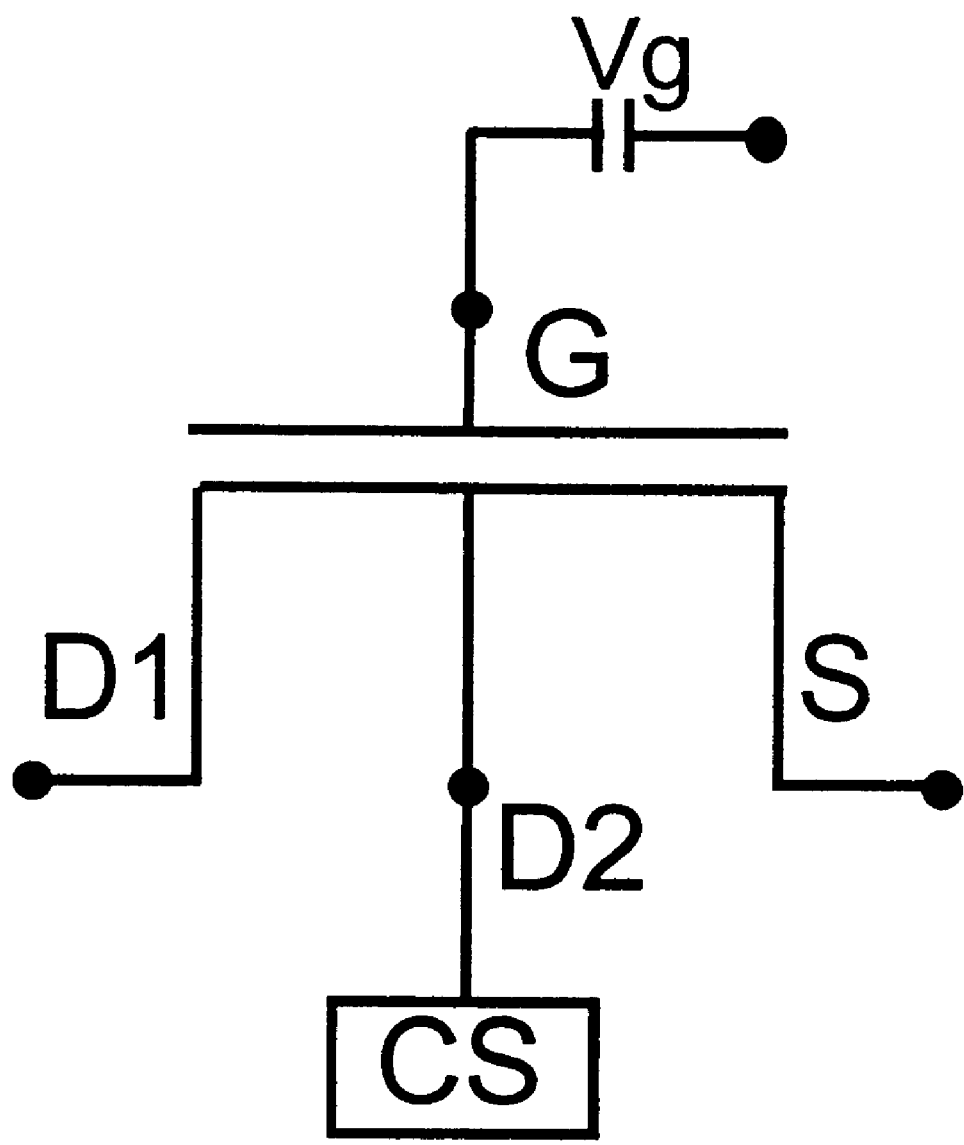
FIG. 3 is a schematic symbol for a field effect transistor according to the present invention.

Referring to FIG. 3 a schematic symbol for a field effect transistor according to the present invention is shown. The field effect transistor includes: a source S, a first drain D1, a gate G coupled to a gate voltage Vg and a second drain D2 coupled to a current source CS.

Figure 4:
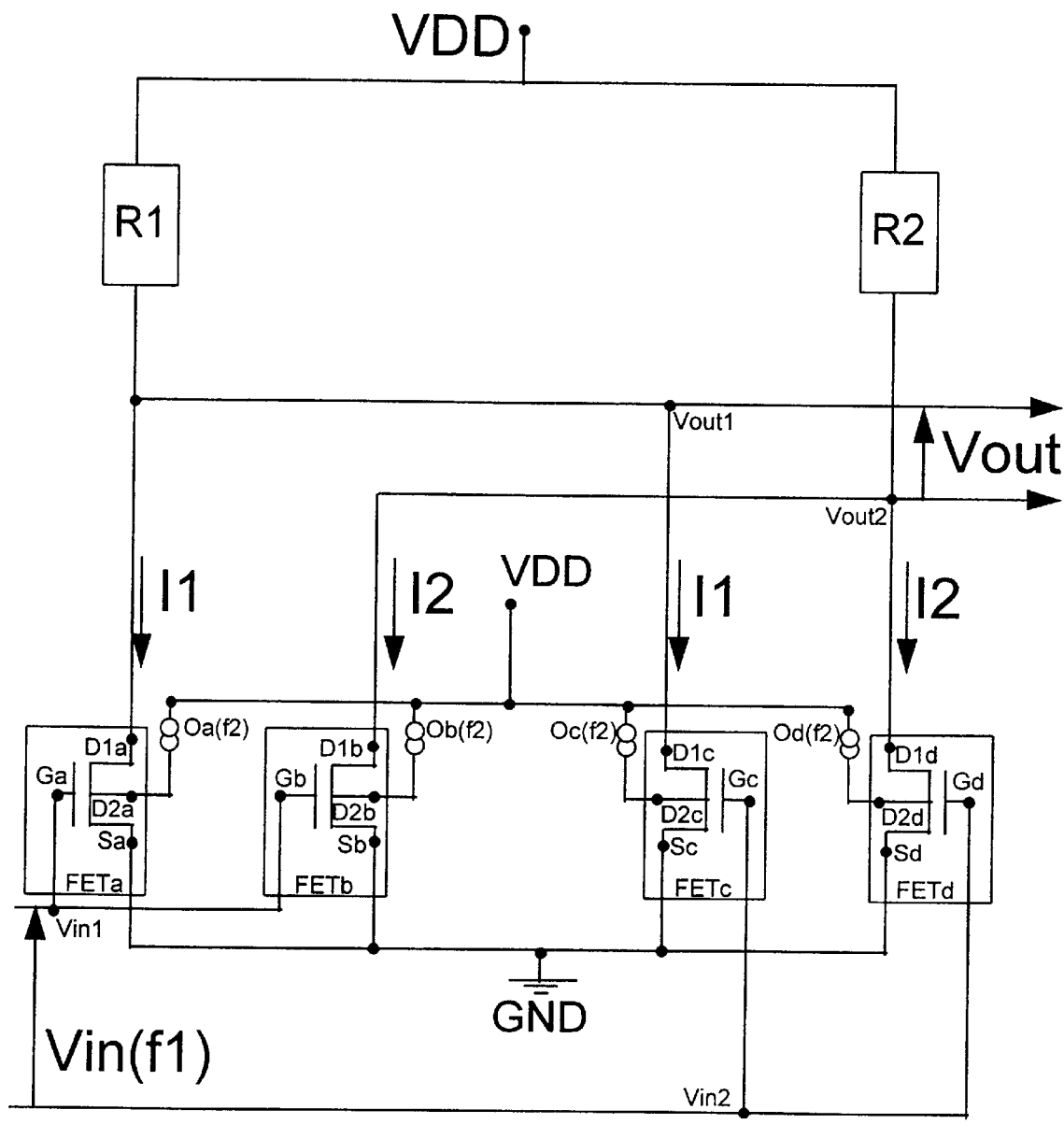
FIG. 4 is a double balanced mixer circuit wherein four field effect transistors according to the present invention are used.

Referring to FIG. 4 a double balanced mixer circuit is shown. this double balanced mixer circuit includes four field effect transistors according to the present invention. After a first introduction towards a possible application of the present double balanced mixer circuit, a functional description of the blocks shown in the figure will be given. Based on this description, the practical implementation of the functional blocks in the figure will be obvious to a person skilled in the art. In addition, the working of the mixer circuit will be described in further detail.

Over the past few years, the supply voltage of wireless phones keeps going down. Indeed, the next generation of wireless phones have to go to as low as possible supply voltages in order to reduce the number of batteries, the cost, the volume and the weight of the handset. The present double balanced mixer circuit accommodates this challenge by using only one level of field effect transistors i.e. four field effect transistors according to the present invention.

The schematic symbol of FIG. 3 is used to represent each field effect transistor included in the double balanced mixer circuit : FETa, FETb, FETc and FETd. Each field effect transistor includes the four terminals which are explained in the previous paragraphs describing FIG. 1, FIG. 2 and FIG. 3:

FETa includes: Sa, Ga, D1$a$ and D2$a$; and
FETb includes: Sb, Gb, D1$b$ and D2$b$; and
FETc includes: Sc, Gc, D1$c$ and D2$c$; and
FETd includes: Sd, Gd, D1$d$ and D2$b$.

The double balanced mixer further includes two resistors R1 and R2 and four local oscillators Oa, Ob, Oc and Od.

Each field effect transistor is coupled between the ground voltage GND and the supply voltage VDD via its source S, its channel, its first drain D1 and one of the resistors R1 or R2, respectively (see FIG. 4).

Each local oscillator is coupled between the voltage supply VDD and the double drain D2 of one of the field effect transistors according to its index e.g. local oscillator Oc is coupled to the double drain D2$c$ of the field effect transistor FETc. The local oscillators are each providing a signal with a frequency f2.

The field effect transistors, resistors and local oscillators are coupled in such a way that:

FETa and FETd are forming together a first differential pair of field effect transistors; and FETb and FETc are forming together a second differential pair of field effect transistors.

It has to be remarked that, as mentioned in a previous paragraph, in this way only one level of transistors is used.

The local oscillators Oa and Od, which are coupled to the first differential pair of field effect transistors, are together active or not active and the local oscillators Ob and Oc, which are coupled to the second differential pair of field effect transistors, are also together active or not active. Both pairs are, however, complementary active. This means that e.g. in the event when Oa and Od are active that Ob and Oc are not active.

The incoming signal Vin=(Vin1−Vin2) with a frequency fi is applied to the gates of each differential pair: Vin1 is applied to the gates D1$a$ and D1$b$ of FETa and FETb, respectively, and Vin2 is applied to the gates D1$c$ and D1$d$ of FETc and FETd, respectively.

The output of the double balanced mixer Vout=(Vout1−Vout2) is provided at the first drain D1 of each differential pair: Vout1 is provided at the first drains D1$a$ and D1$c$ of FETa and FETc, respectively, and Vout2 is provided at the first drains D1$b$ and D1$d$ of FETb and FETd, respectively.

The output signal Vout is a double balanced signal due to the fact that, according to the coupling to active or non-active local oscillators, either the first differential pair of field effect transistors is active or either the second differential pair of field effect transistors is active. Each field effect transistor acts as a single transistor mixer and due to the coupling of the global circuit a double balanced signal is provided at the output of the double balanced mixer.

While the principles of the invention have been described above in connection with specific apparatus, it is to be clearly understood that this description is made only by way of example and not as a limitation on the scope of the invention, as defined in the appended claims.

What is claimed is:

1. A field effect transistor comprising:
   a control terminal;
   a first main terminal;
   a second main terminal;
   a voltage source coupled to said control terminal for providing a control voltage to said control terminal for controlling a flow of carriers flowing from said first main terminal to said second main terminal;
   a double drain terminal; and
   a high input resistance control current source coupled to said double drain terminal for deviating at least a portion of said flow of carriers from said first main terminal to said double drain terminal, said double drain terminal being positioned and adapted in order to enable said deviation.

2. A control method for controlling a field effect transistor which includes a control terminal, a first main terminal, second main terminal and a double drain terminal, said control method comprising the steps of:
   controlling a flow of carriers flowing from said first main terminal to said second main terminal with a control voltage provided by a voltage means being coupled to said control terminal; and controlling, by a high input resistance control current means coupled to the double drain terminal of said field effect transistor to deviate at least a portion of said flow of carriers from said first main terminal to said double drain terminal, said double drain terminal being positioned and adapted in order to enable said deviation.

3. A frequency mixer means comprising at least one field effect transistor, said field effect transistor comprising:

a control terminal;

a first main terminal;

a second main terminal;

a voltage source coupled to said control terminal for providing a control voltage to said control terminal for controlling a flow of carriers flowing from said first main terminal to said second main terminal;

a double drain terminal; and a high input resistance control current source coupled to said double drain terminal providing a current signal to deviate at least a portion of said flow of carriers from said first main terminal to said double drain terminal, wherein said control voltage has a first frequency which is applied to said control terminal and said current signal has a second frequency which is applied to said double drain terminal. said double drain terminal being positioned and adapted in order to enable said deviation.

* * * * *